(12) United States Patent
Flick

(10) Patent No.: US 6,857,425 B2
(45) Date of Patent: Feb. 22, 2005

(54) SOLAR ENERGY COLLECTOR SYSTEM

(76) Inventor: Timothy J. Flick, 1544-27th Ave. South, Fargo, ND (US) 58103

( * ) Notice: Subject to any disclaimer, the term of this patent is extended or adjusted under 35 U.S.C. 154(b) by 73 days.

(21) Appl. No.: 10/128,734

(22) Filed: Apr. 22, 2002

(65) Prior Publication Data

US 2003/0196652 A1 Oct. 23, 2003

(51) Int. Cl.$^7$ .............................. F24J 2/04; H01L 35/00
(52) U.S. Cl. ...................... 126/634; 126/613; 136/206
(58) Field of Search ................................ 126/271, 638, 126/613, 634; 60/26; 136/205, 206; 356/225

(56) References Cited

U.S. PATENT DOCUMENTS

| 3,822,692 A | * | 7/1974 | Demarest | 126/271 |
|---|---|---|---|---|
| 4,082,082 A | | 4/1978 | Harvey | 126/271 |
| 4,129,177 A | | 12/1978 | Adcock | 165/48 |
| 4,251,291 A | * | 2/1981 | Gomez | 136/206 |
| 4,299,205 A | | 11/1981 | Garfield | 126/449 |
| 4,301,789 A | | 11/1981 | Artweger | 126/439 |
| 4,334,524 A | | 6/1982 | McCullough et al. | 126/449 |
| 4,364,375 A | | 12/1982 | Younghouse | 126/444 |
| 4,425,903 A | | 1/1984 | Greiner | 126/419 |
| 4,823,772 A | | 4/1989 | Lenz | 126/448 |
| 4,949,704 A | | 8/1990 | Pflunger | 126/441 |
| 5,931,157 A | | 8/1999 | Aschauer | 126/650 |

FOREIGN PATENT DOCUMENTS

DE 19519978 A1 * 11/1995 ............... F24J/2/20

* cited by examiner

Primary Examiner—Aaron J. Lewis (57) ABSTRACT

A solar energy collector system for reducing heating, air conditioning and power consumption of a building structure. The solar energy collector system includes a housing structure, a collector plate, an insulating sheet positioned between the collector plate and a floor of the housing structure, a thermopile unit within the housing structure, and a fluid positioned below the collector plate. The fluid adjacent the collector plate is heated thereby rising to an upper portion of the housing structure and thermally conducting the thermopile unit for generating electricity. The cooled fluid then passes downwardly below the insulating sheet to a lower portion of the housing structure. A heat exchanger is utilized upon the opposite side of the thermopile unit for transferring the heat to a desired location within or outside of the building structure.

17 Claims, 6 Drawing Sheets

SOLAR ENERGY COLLECTOR SYSTEM

CROSS REFERENCE TO RELATED APPLICATIONS

Not applicable to this application.

STATEMENT REGARDING FEDERALLY SPONSORED RESEARCH OR DEVELOPMENT

Not applicable to this application.

BACKGROUND OF THE INVENTION

1. Field of the Invention

The present invention relates generally to solar collecting devices and more specifically it relates to a solar energy collector system for reducing heating, air conditioning and power consumption of a building structure.

2. Description of the Related Art

Solar collecting devices have been in use for years. Conventional solar collecting devices can be grouped into two categories: heat collectors and electricity generators. Heat collectors typically are comprised of a tank of fluid positioned upon the roof of a building structure that is heated for use within the building structure as heated water. Electricity generators (solar cells) convert sunlight to electricity that may be stored within batteries and utilized within the building structure.

The main problem with conventional solar collecting devices is that they are typically relatively expensive. Another problem with conventional solar collecting devices is that they do not efficiently convert solar energy to usable energy (heat or electricity) for a building structure. Another problem with conventional solar collecting devices is that they are designed as an additional structure for a building structure and not as part of the building structure to lower cost of construction.

Examples of patented devices which are related to the present invention include U.S. Pat. No. 4,301,789 to Artweger; U.S. Pat. No. 4,082,082 to Harvey; U.S. Pat. No. 4,334,524 to McCullough et al; U.S. Pat. No. 4,364,375 to Younghouse; U.S. Pat. No. 4,425,903 to Greiner; U.S. Pat. No. 4,823,772 to Lenz; U.S. Pat. No. 4,949,704 to Pflunger; U.S. Pat. No. 5,931,157 to Aschauer; U.S. Pat. No. 4,299,205 to Garfield; and U.S. Pat. No. 4,129,177 to Adcock.

While these devices may be suitable for the particular purpose to which they address, they are not as suitable for reducing heating, air conditioning and power consumption of a building structure. Conventional solar collecting devices do not efficiently utilize solar energy.

In these respects, the solar energy collector system according to the present invention substantially departs from the conventional concepts and designs of the prior art, and in so doing provides an apparatus primarily developed for the purpose of reducing heating, air conditioning and power consumption of a building structure.

BRIEF SUMMARY OF THE INVENTION

In view of the foregoing disadvantages inherent in the known types of solar collectors now present in the prior art, the present invention provides a new solar energy collector system construction wherein the same can be utilized for reducing heating, air conditioning and power consumption of a building structure.

The general purpose of the present invention, which will be described subsequently in greater detail, is to provide a new solar energy collector system that has many of the advantages of the solar collectors mentioned heretofore and many novel features that result in a new solar energy collector system which is not anticipated, rendered obvious, suggested, or even implied by any of the prior art solar collectors, either alone or in any combination thereof.

To attain this, the present invention generally comprises a housing structure, a collector plate, an insulating sheet positioned between the collector plate and a floor of the housing structure, a thermopile unit within the housing structure, and a fluid positioned below the collector plate. The fluid adjacent the collector plate is heated thereby rising to an upper portion of the housing structure and thermally conducting the thermopile unit for generating electricity. The cooled fluid then passes downwardly below the insulating sheet to a lower portion of the housing structure. A heat exchanger is utilized upon the opposite side of the thermopile unit for transferring the heat to a desired location within or outside of the building structure.

There has thus been outlined, rather broadly, the more important features of the invention in order that the detailed description thereof may be better understood, and in order that the present contribution to the art may be better appreciated. There are additional features of the invention that will be described hereinafter and that will form the subject matter of the claims appended hereto.

In this respect, before explaining at least one embodiment of the invention in detail, it is to be understood that the invention is not limited in its application to the details of construction and to the arrangements of the components set forth in the following description or illustrated in the drawings. The invention is capable of other embodiments and of being practiced and carried out in various ways. Also, it is to be understood that the phraseology and terminology employed herein are for the purpose of the description and should not be regarded as limiting.

A primary object of the present invention is to provide a solar energy collector system that will overcome the shortcomings of the prior art devices.

A second object is to provide a solar energy collector system for reducing heating, air conditioning and power consumption of a building structure.

Another object is to provide a solar energy collector system that provides an inexpensive system for moderating a building environment.

An additional object is to provide a solar energy collector system that may be utilized upon large portions of a roof and that may be utilized for large portions of a roof.

A further object is to provide a solar energy collector system that produces electricity from heat rather than sunlight.

Another object is to provide a solar energy collector system that increases the overall efficiency in utilizing solar energy.

A further object is to provide a solar energy collector system that is cheaper to manufacture than conventional photovoltaic power cells.

Another object is to provide a solar energy collector system that reduces the air conditioning requirements of a building structure.

A further object is to provide a solar energy collector system that may be utilized as a source for hot water, heat and electrical power.

Other objects and advantages of the present invention will become obvious to the reader and it is intended that these objects and advantages are within the scope of the present invention.

To the accomplishment of the above and related objects, this invention may be embodied in the form illustrated in the accompanying drawings, attention being called to the fact, however, that the drawings are illustrative only, and that changes may be made in the specific construction illustrated and described within the scope of the appended claims.

DESCRIPTION OF THE DRAWINGS

Various other objects, features and attendant advantages of the present invention will become fully appreciated as the same becomes better understood when considered in conjunction with the accompanying drawings, in which like reference characters designate the same or similar parts throughout the several views, and wherein.

DESCRIPTION OF THE INVENTION

Turning now descriptively to the drawings, in which similar reference characters denote similar elements throughout the several views, FIGS. 1 through 6 illustrate a solar energy collector system 10, which comprises a housing structure 20, a collector plate 60, an insulating sheet positioned between the collector plate 60 and a floor of the housing structure 20, a thermopile unit 40 within the housing structure 20, and a fluid positioned below the collector plate 60. The fluid adjacent the collector plate 60 is heated thereby rising to an upper portion of the housing structure 20 and thermally conducting the thermopile unit 40 for generating electricity. The cooled fluid then passes downwardly below the insulating sheet to a lower portion of the housing structure 20. A heat exchanger 90 is utilized upon the opposite side of the thermopile unit 40 for transferring the heat to a desired location within or outside of the building structure.

Figure 1:
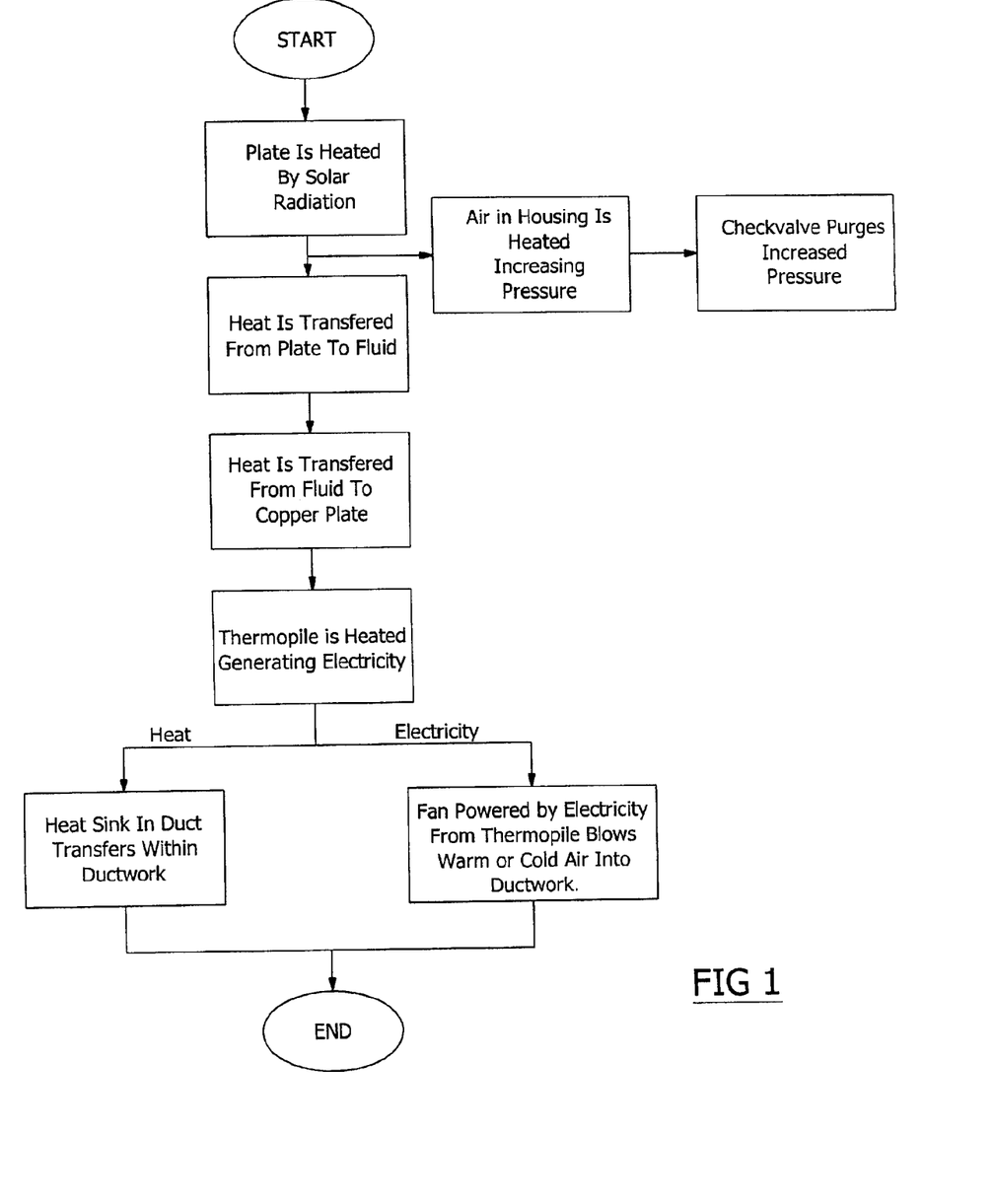
FIG. 1 is a flowchart of the operation of the present invention.
Figure 2:
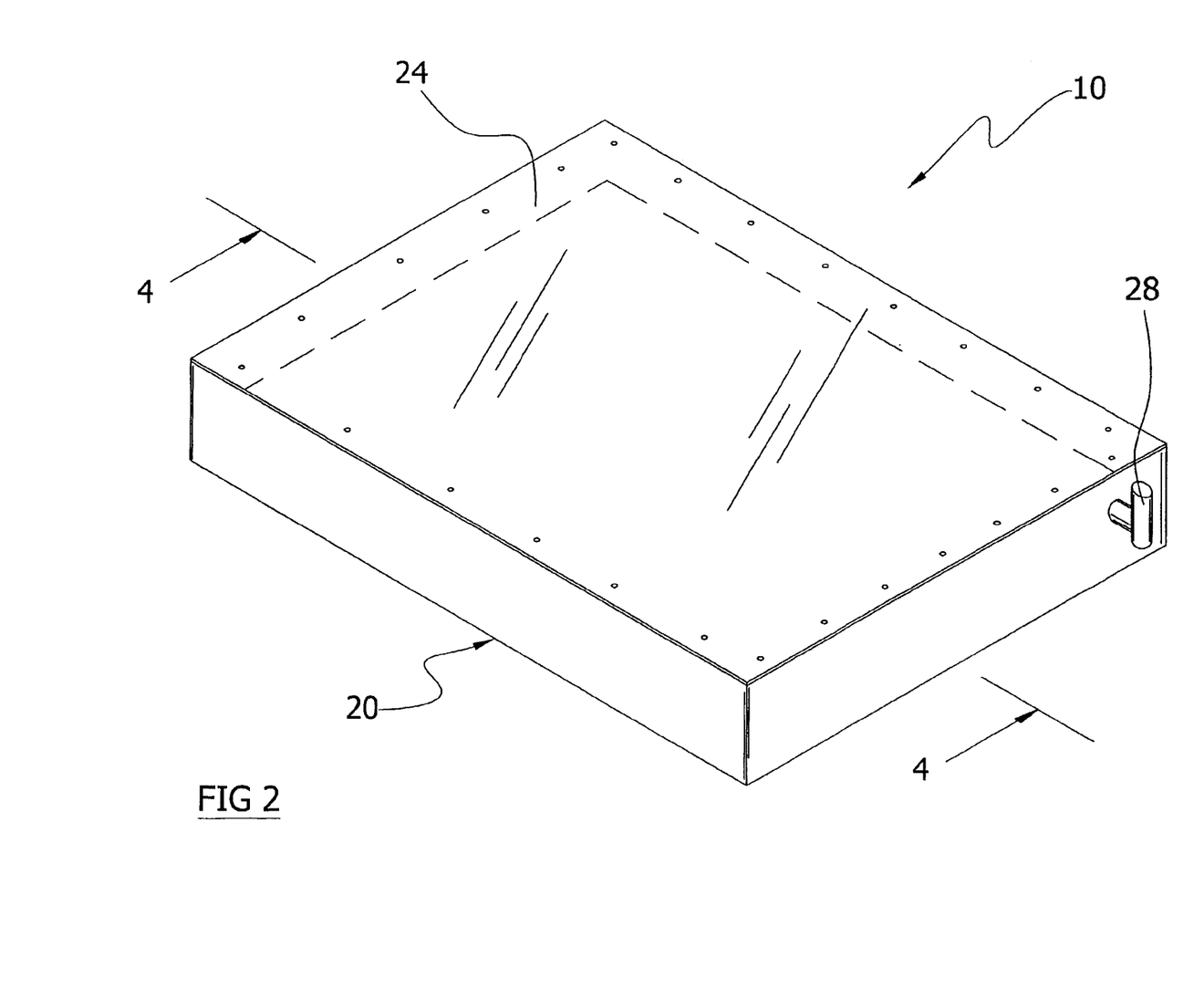
FIG. 2 is an upper perspective view of the present invention.

FIG. 2 illustrates an upper perspective of the present invention having a generally flat structure. The present invention designed to be utilized upon a pre-existing roof surface or as a roof surface. Various other configurations may be utilized in conjunction with the present invention.

Figure 3:
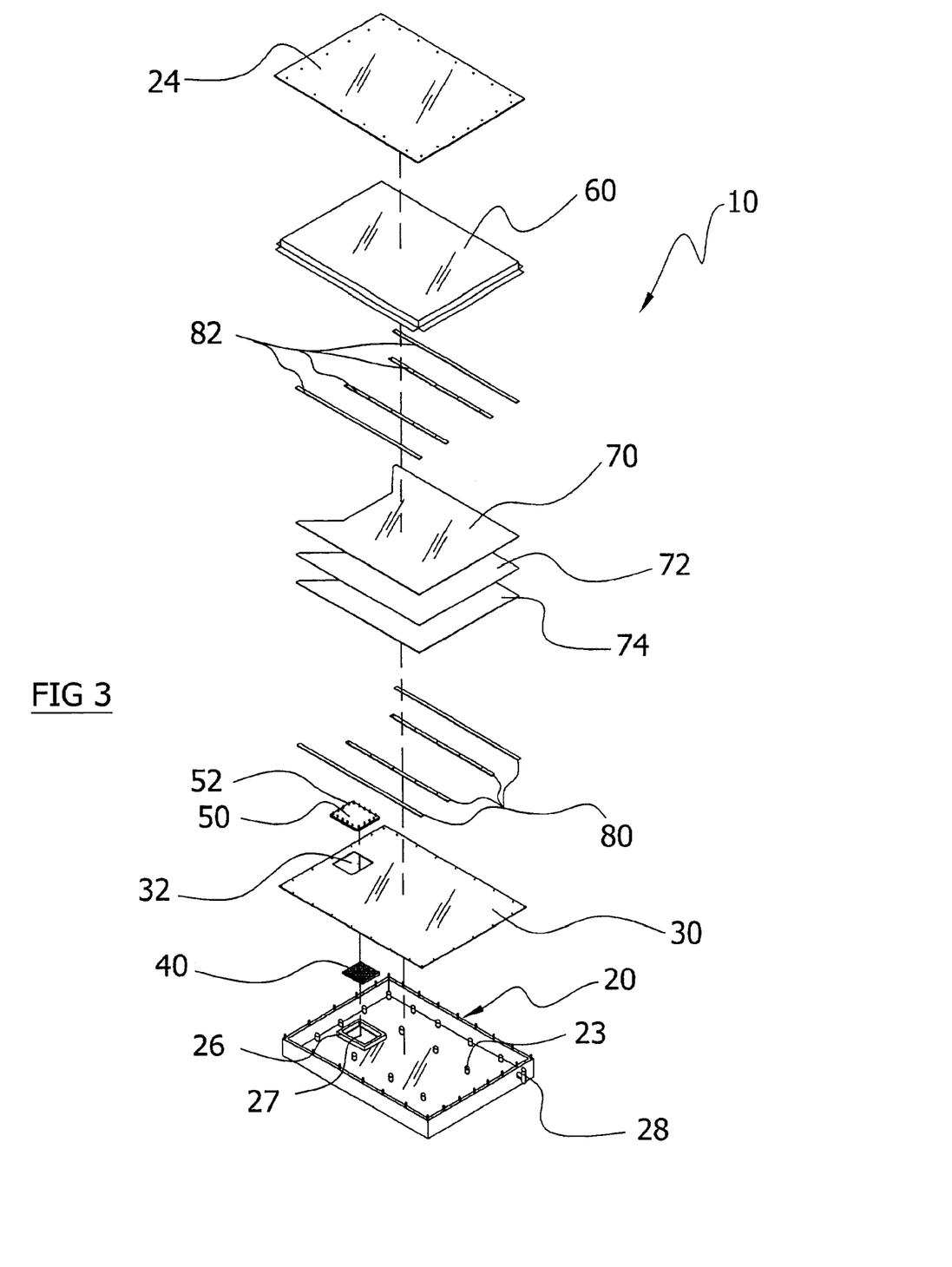
FIG. 3 is an exploded upper perspective view of the present invention.

As shown in FIG. 3 of the drawings, the housing structure 20 includes an interior portion 22 that receives the main components of the present invention. The housing structure 20 may have various shapes and sizes that may be required for usage upon a roof of the building structure. The housing structure 20 may also be constructed of various types of building materials.

A housing opening 27 extends through an upper portion of the housing structure 20 for connecting to a heat exchanger 90 (heat sink). The housing opening 27 may have various sizes and shapes suitable for connecting to the heat exchanger 90. The heat exchanger 90 utilizes air, gas or fluid to exchange heat transferred from the thermopile unit 40 wherein the conducted heat may be dispersed to the appropriate locations within the building structure for heating or outside of the building structure to reducing air conditioning requirements of the building structure.

Figure 4:
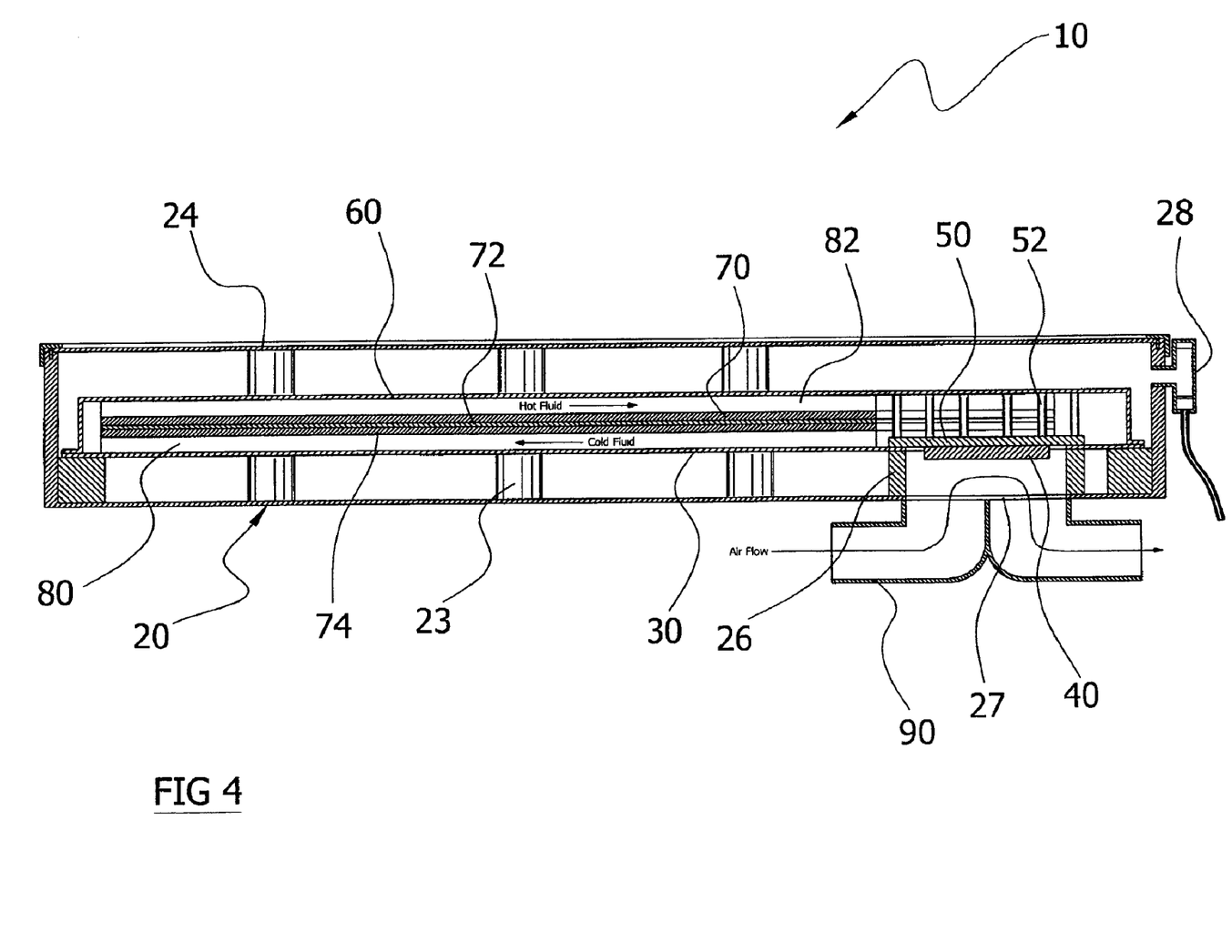
FIG. 4 is a cross sectional view taken along line 4—4 of FIG. 2.

As shown in FIGS. 3 and 4 of the drawings, a plurality of support posts 23 extend from the interior floor of the housing structure 20 to support a first plate 30. The first plate 30 is secured within the housing structure 20 in a sealed manner to prevent the fluid from passing through. A first support 26 surrounding the housing opening 27 is attached to the bottom surface of the first plate 30 about a corresponding first opening 32 within the first plate 30. The first opening 32 is covered with a conducting member 50 that is comprised of a material capable of efficient thermal conduction such as a copper plate or similar material. The thermopile unit 40 is attached to the lower surface of the conducting member 50 as shown in FIG. 4 of the drawings. A plurality of spacers 52 extend upwardly from the conducting member 50 to engage and support a portion of the collector plate 60 as best shown in FIG. 4 of the drawings.

As shown in FIGS. 3 and 4 of the drawings, a plurality of first support members 80 are attached to the upper surface of the first plate 30. The inner first support members 80 are preferably shorter in length to allow for fluid flow near the conducting member 50 as shown in FIG. 3 of the drawings.

A first insulating sheet 70 and a second insulating sheet 74 are attached about a middle support sheet 72 defining an insulating barrier to separate the heated and cooled fluid in an insulated manner. The first insulating sheet 70 and the second insulating sheet 74 may be comprised of any well-known insulating material capable of withstanding relatively high temperatures. The middle support sheet 72 is comprised of a rigid material such as but not limited to aluminum for providing support to the insulating barrier. The insulating barrier is attached to the first support members 80 opposite of the first plate 30 thereby defining a lower fluid channel for allowing cooled fluid from the conducting member 50 to return to a lower portion of the upper fluid channel to be heated as illustrated in FIGS. 3 and 4 of the drawings. The insulating barrier also has a cutout at the end adjacent the conducting member 50 for facilitating the flow of heated fluid about the conducting member 50 and between the lower and upper fluid channels.

Figure 6:
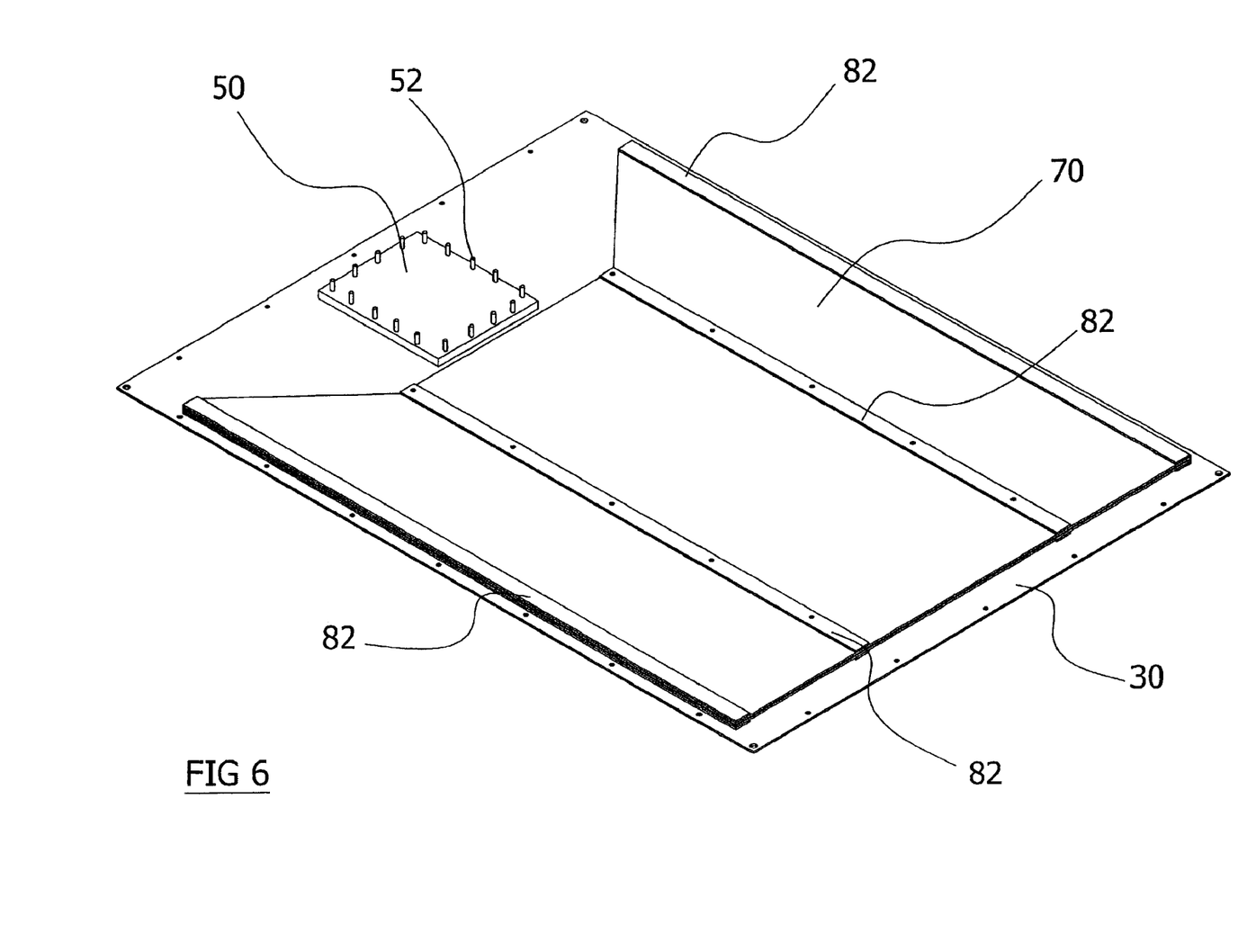
FIG. 6 is an upper perspective view of the insulating sheet positioned upon the first plate with the conducting member attached upon.

As shown in FIGS. 3 and 6 of the drawings, a plurality of second support members 82 are attached to the upper surface of the first insulating sheet 70. The inner second support members 82 are preferably shorter in length to allow for fluid flow near the conducting member 50 as shown in FIG. 3 of the drawings.

Figure 5:
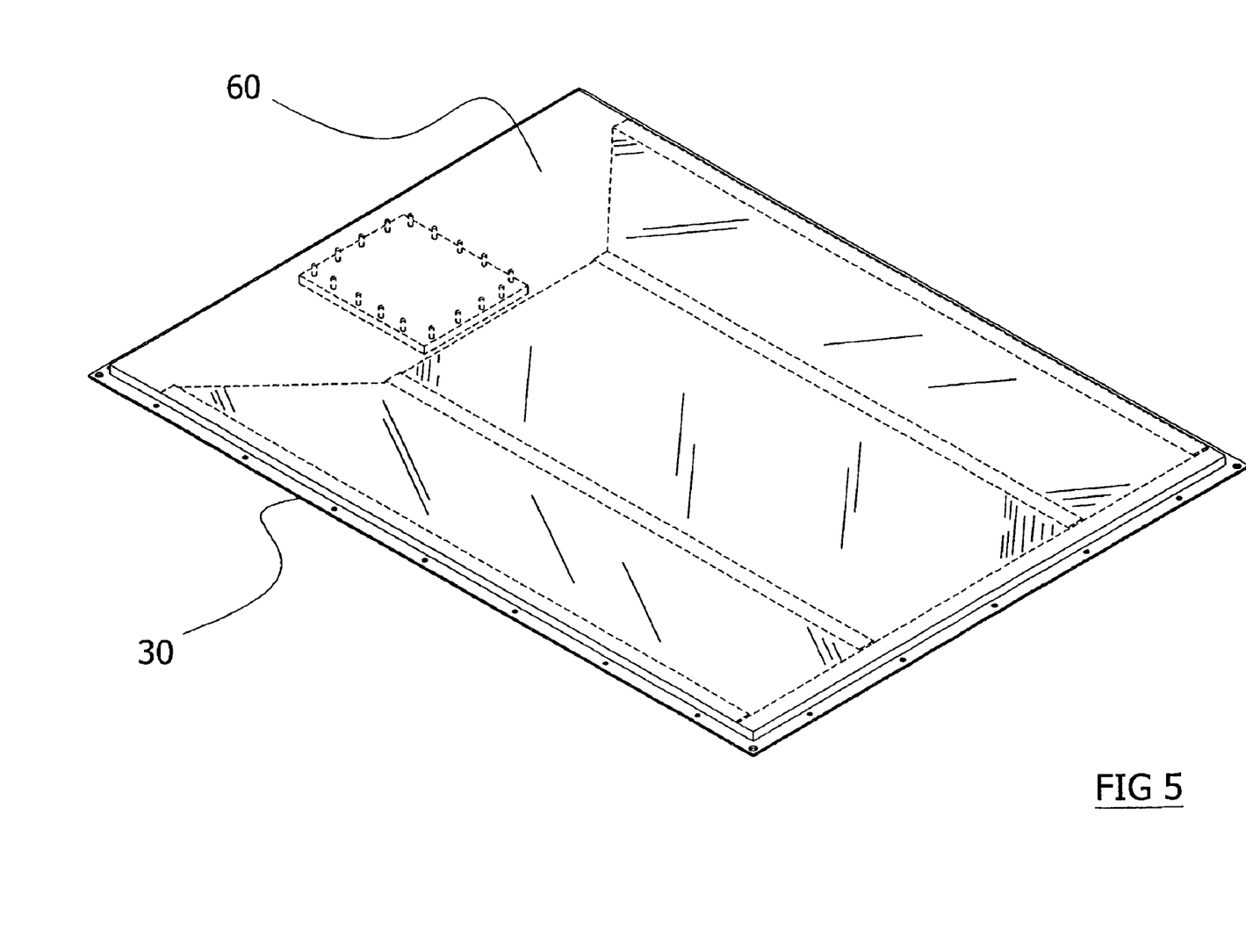
FIG. 5 is an upper perspective view of the collector plate surrounding the first plate and the insulating sheets between thereof.

As shown in FIGS. 3, 4 and 5 of the drawings, a collector plate 60 is attached in a sealed manner to the first plate 30 and adjacent the second support members 82. An upper fluid channel is defined between the first insulating sheet 70 and the collector plate 60 for allowing the heated fluid to pass upwardly to the conducting member 50 as shown in FIG. 4 of the drawings.

The collector plate 60 is comprised of a material capable of absorbing solar heat and efficiently transferring the conducted solar heat to the fluid within the upper fluid channel. The collector plate 60 may be coated with various solar energy absorbing coatings. The cavity defined between the collector plate 60 and the first plate 30 is a sealed heating unit for heating the fluid within and transferring this heat to the conducting member 50.

The fluid positioned within the heating unit is comprised of a fluid capable of efficiently receiving and transferring heat from the collector plate 60 to the conducting member 50. The fluid is preferably comprised of an oil substance for reducing the production of gases during heating/cooling, however, various other fluids may be utilized within the heating unit.

A cover 24 is preferably attached about the housing structure 20 for enclosing the entire interior portion 22 as shown in FIGS. 3, 4 and 5 of the drawings. The cover 24 is comprised of a transparent material for allowing for the passage of solar energy to the collector plate 60. The cover 24 may be coated for reducing the amount of solar energy reflected by the collector plate 60 thereby increasing the heating of the collector plate 60. A pressure relief valve 28 may be utilized within the housing structure 20 between the cover 24 and the collector plate 60 for allowing for the release of gas within at a predetermined pressure to avoid damaging pressure from accumulating within but also reducing the exchange of heat from the housing structure 20.

In use, the housing structure 20 is either attached to an existing roof or built within the building structure as part of the roof in the direction of the sun at an angle of at least 5 degrees. When the solar energy from the sun passes through the transparent cover 24, the solar energy heats the collector plate 60. The fluid beneath the collector plate 60 within the upper fluid channel of the heating unit conducts this heat and then rises upwardly along the upper fluid channel toward the conducting member 50 as shown in FIG. 4 of the drawings. The heated fluid passes over the conducting member 50 which conducts the heat energy from the fluid and transfers the heat energy to the thermopile unit 40 thereby generating electricity as shown in FIG. 4 of the drawings. The heat exchanger 90 conducts the heat from the thermopile unit 40 thereby increasing the efficiency of the thermopile unit 40 and providing heat for the interior of the building structure if required. If heating within the building structure is not required nor desired, the heat exchanger 90 may direct the heat outside of the building structure thereby reducing solar heating of the building structure. The cooled fluid then passes downwardly along the lower fluid channel wherein it eventually returns to the upper fluid channel through a lower passage at the end of the insulating barrier to be heated again as shown in FIG. 4 of the drawings. This process continues repeated thereby providing a continuous electrical supply from the thermopile unit 40 and heat supply through the heat exchanger 90. The heat exchanger 90 may also provide heated water for usage within the building structure if desired.

As to a further discussion of the manner of usage and operation of the present invention, the same should be apparent from the above description. Accordingly, no further discussion relating to the manner of usage and operation will be provided.

With respect to the above description then, it is to be realized that the optimum dimensional relationships for the parts of the invention, to include variations in size, materials, shape, form, function and manner of operation, assembly and use, are deemed to be within the expertise of those skilled in the art, and all equivalent structural variations and relationships to those illustrated in the drawings and described in the specification are intended to be encompassed by the present invention.

Therefore, the foregoing is considered as illustrative only of the principles of the invention. Further, since numerous modifications and changes will readily occur to those skilled in the art, it is not desired to limit the invention to the exact construction and operation shown and described, and accordingly, all suitable modifications and equivalents may be resorted to, falling within the scope of the invention.

I claim:

1. A solar energy collector system, comprising:
   a housing structure;
   a transparent cover positioned about said housing structure;
   a heating unit within said housing structure for thermally transferring solar heat energy to a fluid within said heating unit, wherein said heating unit is comprised of:
   a first plate;
   an insulating barrier attached to said first plate with a lower fluid channel extending between; and
   a conducting member attached in a sealed manner about said first plate defining an upper fluid channel between said insulating barrier and said conducting member; and
   a thermopile unit within said housing structure in thermal communication with said heating unit.

2. The solar energy collector system of claim 1, wherein said thermopile unit is positioned adjacent an upper portion of said heating unit.

3. The solar energy collector system of claim 1, including a conducting member positioned within said heating unit and connected to said thermopile unit.

4. The solar energy collector system of claim 1, wherein said first plate includes a first opening and a conducting member attached about said first opening, wherein said conducting member is connected to said thermopile.

5. The solar energy collector system of claim 4, wherein said conducting member is comprised of copper.

6. The solar energy collector system of claim 1, wherein said insulating barrier is comprised of a first insulating sheet, a middle support sheet attached to said first insulating sheet and a second insulating sheet attached to the middle support sheet opposite of the first insulating sheet, wherein said middle support sheet is comprised of a rigid material.

7. The solar energy collector system of claim 1, including a plurality of first support members positioned between said first plate and said insulating barrier, and a plurality of second support members positioned between said insulating barrier and said collector plate.

8. The solar energy collector system of claim 1, including a plurality of support posts extending from an interior floor of said housing structure and supporting said heating unit a finite distance above said interior floor.

9. A solar energy collector system, comprising:
   a housing structure;
   a heating unit within said housing structure for thermally transferring solar heat energy to a fluid within said heating unit, wherein said heating unit is comprised of:
   a first plate;
   an insulating barrier attached to said first plate with a lower fluid channel extending between; and
   a conducting member attached in a sealed manner about said first plate defining an upper fluid channel between said insulating barrier and said conducting member; and
   a thermopile unit within said housing structure in thermal communication with said heating unit; and
   a heat exchanger connected to said thermopile unit opposite of said heating unit.

10. The solar energy collector system of claim 9, wherein said thermopile unit is positioned adjacent an upper portion of said heating unit.

11. The solar energy collector system of claim 9, including a conducting member positioned within said heating unit and connected to said thermopile unit.

12. The solar energy collector system of claim 9, wherein said first plate includes a first opening and a conducting member attached about said first opening, wherein said conducting member is connected to said thermopile.

13. The solar energy collector system of claim 12, wherein said conducting member is comprised of copper.

14. The solar energy collector system of claim 9, wherein said insulating barrier is comprised of a first insulating sheet, a middle support sheet attached to said first insulating sheet and a second insulating sheet attached to the middle support sheet opposite of the first insulating sheet, wherein said middle support sheet is comprised of a rigid material.

15. The solar energy collector system of claim 9, including a plurality of first support members positioned between said first plate and said insulating barrier, and a plurality of second support members positioned between said insulating barrier and said collector plate.

16. The solar energy collector system of claim 9, including a plurality of support posts extending from an interior floor of said housing structure and supporting said heating unit a finite distance above said interior floor.

17. A solar energy collector system, comprising:

a housing structure;

a heating unit within said housing structure for thermally transferring solar beat energy to a fluid within said heating unit, wherein said heating unit is comprised of a first plate, an insulating barrier attached to said first plate with a lower fluid channel extending between, and a conducting member attached in a sealed manner about said first plate defining an upper fluid channel between said insulating barrier and said conducting member;

a thermopile unit within said housing structure in thermal communication with said heating unit;

a heat exchanger connected to said thermopile unit opposite of said heating unit;

a transparent cover positioned about said housing structure; and a pressure relief valve fluidly connected within said housing structure.

* * * * *